United States Patent
Jousset et al.

(10) Patent No.: US 10,435,498 B2
(45) Date of Patent: Oct. 8, 2019

(54) THERMOPLASTIC COMPOSITION HAVING A HIGH POLYAMIDE GRAFTING RATE

(71) Applicant: ARKEMA FRANCE, Colombes (FR)

(72) Inventors: Dominique Jousset, Bougival (FR); Jean-Jacques Flat, Goupillieres (FR); Samuel Devisme, Rouen (FR); Thomas Fine, Lyons (FR); Stéphane Bizet, Barc (FR)

(73) Assignee: ARKEMA FRANCE, Colombes (FR)

( * ) Notice: Subject to any disclaimer, the term of this patent is extended or adjusted under 35 U.S.C. 154(b) by 0 days.

(21) Appl. No.: 14/397,273

(22) PCT Filed: Apr. 25, 2013

(86) PCT No.: PCT/FR2013/050919
§ 371 (c)(1),
(2) Date: Oct. 27, 2014

(87) PCT Pub. No.: WO2013/160620
PCT Pub. Date: Oct. 31, 2013

(65) Prior Publication Data
US 2015/0333205 A1    Nov. 19, 2015

(30) Foreign Application Priority Data

Apr. 26, 2012 (FR) ..................... 12 53839

(51) Int. Cl.
| | | |
|---|---|---|
| *C08F 255/02* | (2006.01) | |
| *C08L 51/06* | (2006.01) | |
| *C08G 81/02* | (2006.01) | |
| *H01L 31/048* | (2014.01) | |
| *C08L 23/00* | (2006.01) | |
| *C08L 77/00* | (2006.01) | |
| *C08L 87/00* | (2006.01) | |
| *C08J 5/18* | (2006.01) | |
| *C08L 77/02* | (2006.01) | |

(52) U.S. Cl.
CPC .......... *C08F 255/02* (2013.01); *C08G 81/028* (2013.01); *C08J 5/18* (2013.01); *C08L 51/06* (2013.01); *C08L 87/005* (2013.01); *H01L 31/0481* (2013.01); *C08G 2190/00* (2013.01); *C08J 2387/00* (2013.01); *C08L 23/00* (2013.01); *C08L 77/00* (2013.01); *C08L 77/02* (2013.01); *C08L 2203/204* (2013.01); *C08L 2203/206* (2013.01); *Y02E 10/50* (2013.01)

(58) Field of Classification Search
CPC ........ C08F 255/02; C08G 81/028; C08J 5/18; C08L 51/06; C08L 87/005
USPC ......................................... 525/184; 136/259
See application file for complete search history.

(56) References Cited

U.S. PATENT DOCUMENTS

| | | | |
|---|---|---|---|
| 3,963,799 A | 6/1976 | Starkweather, Jr. | |
| 3,976,720 A | 8/1976 | Hammer et al. | |
| 5,342,886 A | 8/1994 | Glotin et al. | |
| 2010/0099817 A1 | 4/2010 | Bizet et al. | |
| 2011/0091707 A1* | 4/2011 | Jousset | B32B 27/28 428/220 |
| 2011/0315199 A1* | 12/2011 | Vogt | C08G 81/028 136/251 |

FOREIGN PATENT DOCUMENTS

| | | | | |
|---|---|---|---|---|
| EP | 2196489 A1 | 6/2010 | | |
| FR | 2291225 A1 | 6/1976 | | |
| FR | 2912150 A1 | 8/2008 | | |
| FR | 2918150 A1 | 1/2009 | | |
| FR | 2930556 A1 * | 10/2009 | ............. | B32B 27/28 |

* cited by examiner

*Primary Examiner* — Kelechi C Egwim
(74) *Attorney, Agent, or Firm* — Buchanan Ingersoll & Rooney P.C.

(57) ABSTRACT

A polyamide-grafted polyolefin composition in which the grafting rate of the composition is between 41% and 70% by weight. Also, a thermoplastic composition including a polyolefin backbone comprising a residue of at least one unsaturated monomer (X) and a plurality of polyamide grafts, in which: the polyamide grafts are attached to the polyolefin backbone by the residue of the unsaturated monomer (X) comprising a functional group capable of reacting by a condensation reaction with a polyamide having at least one amine end and/or at least one carboxylic acid end, the residue of the unsaturated monomer (X) is attached to the backbone by grafting or copolymerization, wherein the polyamide grafts represent from 41% to 70%, preferably from 45% to 70%, by mass of said polyamide-grafted polymer. Also, a thermoplastic film for encapsulating and/or protecting the back ("backsheet") of a photovoltaic module that includes said polyamide-grafted polyolefin composition.

15 Claims, 1 Drawing Sheet

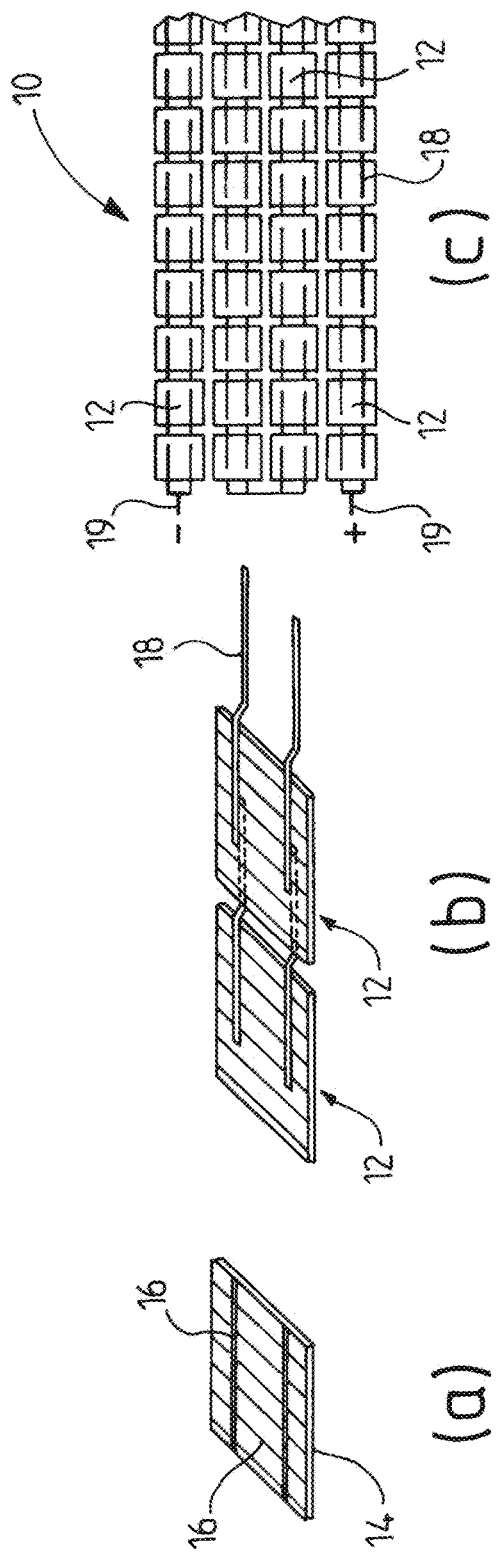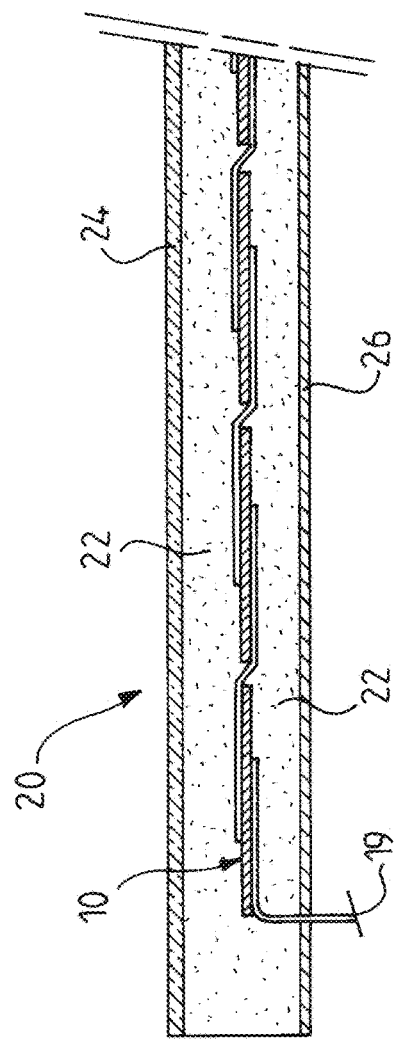

THERMOPLASTIC COMPOSITION HAVING A HIGH POLYAMIDE GRAFTING RATE

FIELD OF THE INVENTION

A subject matter of the invention is a thermoplastic composition comprising a polyamide-grafted polyolefin, the content of polyamide grafting of which is high. The present invention also relates to the use of this composition in a photovoltaic module, more specifically in one or more of the layers forming such a module, more particularly in the encapsulant-forming layer.

Global warming, related to the greenhouse gases given off by fossil fuels, has led to the development of alternative energy solutions which do not emit such gases during the operation thereof, such as, for example, photovoltaic modules. A photovoltaic module comprises a "photovoltaic cell", this cell being capable of converting light energy into electricity.

Many types of photovoltaic panel structures exist.

A conventional photovoltaic cell has been represented in FIG. 1; this photovoltaic cell 10 comprises individual cells 12, an individual cell comprising a photovoltaic sensor 14, generally based on silicon treated in order to obtain photo-electric properties, in contact with electron collectors 16 placed above (upper collectors) and below (lower collectors) the photovoltaic sensor. The upper collectors 16 of an individual cell are connected to the lower collectors 16 of another individual cell 12 via conducting bars 18, generally composed of an alloy of metals. All these individual cells 12 are connected to one another, in series and/or in parallel, to form the photovoltaic cell 10. When the photovoltaic cell 10 is placed under a light source, it delivers a direct electric current which can be recovered at the terminals 19 of the cell 10.

With reference to FIG. 2, the photovoltaic module 20 comprises the photovoltaic cell 10 of FIG. 1 encased in an "encapsulant", the latter being composed of an upper part and of a lower part. An upper protective layer 24 (known under the term "front sheet", used in the continuation) and a layer which protects the back of the module (known under the term "back sheet", also used in the continuation) 26 are positioned on either side of the encapsulated cell.

Impact and moisture protection of the photovoltaic cell 10 is provided by the upper protective layer 24, generally made of glass.

The back sheet 26 contributes to the moisture protection of the photovoltaic module 20 and to the electrical insulation of the individual cells 12 in order to prevent any contact with the external environment.

The encapsulant 22 has to perfectly match the shape of the space existing between the photovoltaic cell 10 and the protective layers 24 and 26 in order to avoid the presence of air, which would limit the output of the photovoltaic module. The encapsulant 22 must also prevent contact of the individual cells 12 with atmospheric oxygen and water, in order to limit the corrosion thereof. The upper part of the encapsulant 22 is included between the cell 10 and the upper protective layer 24. The lower part of the encapsulant 22 is included between the cell 10 and the back sheet 26.

In the presence of solar radiation, heating occurs inside the solar module at temperatures of 80° C. (or more) may be reached, which necessitates that the layers be perfectly bonded to one another throughout the life cycle of the module.

STATE OF THE ART

Currently, compositions are known in the field of photovoltaic modules which are particularly advantageous from the view point of their thermomechanical qualities as including polyamide-grafted polyolefins up to 40% of polyamide grafts by weight.

This limit of 40% of polyamide grafts has never been surmounted. Thus, the documents of the applicant company FR 2 918 150 or EP 2 196 489 are known which disclose compositions based on polyamide-grafted polyolefin in which the mass of polyamide is between 15% and 30% and reaches up to 39.5% of the composition. Sometimes these documents claim such compositions with higher masss of grafted polyamide but no example of such composition is given and has never been produced, considering the disadvantages of these contents of grafted polyamide.

This is because a person skilled in the art knows that, above this limit, the polyamide grafts will very substantially increase the viscosity, that is to say that the MFI (Melt Flow Index) will decrease down to a value of close to 0, which will in particular render the process of the preparation of the composition completely impossible.

Furthermore, the person skilled in the art knows that the increase in polyamide in the composition will have a negative effect on the transparency of the composition, which renders the latter unsuitable for use in applications where the transparency of the composition is desired, indeed even necessary, in particular in the field of photovoltaics for the "front sheet" layers and in particular for the encapsulant layer.

BRIEF DESCRIPTION OF THE INVENTION

It has been found by the applicant company, after various experiments and handling operations, that, contrary to the teachings well known to a person skilled in the art, a polyolefin composition comprising a degree of polyamide grafting of between 41% and 70% by weight of the composition exhibits a major technical advantage.

Thus, by appropriately choosing the polyamide to be grafted to the polyolefin backbone, such a composition comprising polyamide grafts at a content of between 41% and 70% by weight exhibits an MFI, admittedly below but stable, indeed even which increases for the high polyamide contents, and also a transparency which is stable, indeed even improved, with respect to the same compositions comprising a lower content of grafted polyamide; it furthermore being understood that the composition according to the invention exhibits the distinguishing feature of being nano structured.

Furthermore, it has been found, by the applicant company, that such a composition diluted in a polyolefin exhibits, contrary to what might be anticipated, with respect to an identical composition exhibiting exactly similar polyamide contents (but not resulting from a polyamide-grafted polyolefin having a polyamide mass of between 41% and 70%, that is to say a lower polyamide mass than this 41%-70% range), either a greater creep strength or an equivalent creep strength and a greater fluidity, making it possible to facilitate the processing of said composition. The alternative between the properties obtained depends on the degree of polyamide grafting, in other words the mass of grafted polyamide, with respect to the mass of the composition; it being considered that the greater creep strength is obtained for a mass of grafted polyamide of between 41% and 55% of the composition whereas the stabilization of the creep characteristic, while having a greater fluidity, is obtained for a mass of grafted polyamide of between 55% and 70% by weight of the composition.

Thus, the present invention relates to a thermoplastic composition comprising a polyolefin backbone comprising a residue of at least one unsaturated monomer X and a plurality of polyamide grafts, in which:

the polyamide grafts are attached to the polyolefin backbone by the residue of the unsaturated monomer X comprising a functional group capable of reacting by a condensation reaction with a polyamide having at least one amine end and/or at least one carboxylic acid end, the residue of the unsaturated monomer X is attached to the backbone by grafting or copolymerization, characterized in that the polyamide grafts represent from 41% to 70%, preferably between 45% and 70%, by mass of said polyamide-grafted polymer.

Other advantageous characteristics of the invention are specified subsequently:

Advantageously, the abovesaid grafted polymer is nanostructured.

According to a distinguishing feature of the invention, the number-average molar mass of the abovesaid polyamide grafts of the abovesaid grafted polymer is within the range extending from 1000 to 10 000 g/mol.

Likewise, for the abovesaid grafted polymers, the number of monomers X attached to the polyolefin backbone is greater than or equal to 1.3 and/or less than or equal to 20.

According to one aspect of the invention, the choice of the molar mass of the polyamide grafts, in order to obtain the polyamide-grafted polymer in which the polyamide grafts represent from 41% to 70% by mass of said polymer, depends on the one hand, on the molar mass of the polyolefin backbone and, on the other hand, on the content of monomers X on said polyolefin backbone.

Preferably, at least one polyamide graft of the grafted polymer comprises at least one copolyamide and/or one polyamide 6.

Preferably, the unsaturated monomer X is a maleic anhydride.

According to one possibility offered by the invention, the polyamide-grafted polyolefin composition of the invention will be diluted in a matrix. From this view point, the composition according to the invention will then additionally comprise a matrix composed of at least one polyolefin and/or one polyamide, the ratio by weight of said matrix with respect to the polyamide-grafted polyolefin composition being between 9/1 and 1/9 (in other words, the composition according to the invention is present in the matrix, by weight, between 10% and 90%), preferably between 4/1 and 1/4 (20% to 80%).

The invention also relates to a film comprising the composition according to the invention as described above.

The invention also relates to a thermoplastic film of a photovoltaic module, said photovoltaic module comprising at least two layers, one of which forms the encapsulant layer and/or a back protective layer, characterized in that the encapsulant layer and/or the back protective layer comprises the polyamide-grafted polyolefin composition as described above.

Advantageously, the encapsulant layer and/or the back protective layer additionally comprises a polyolefin, the ratio by weight of said polyolefin with respect to the polyamide-grafted polyolefin composition being between 9/1 and 1/4 (in other words, the composition according to the invention is present in the matrix, by weight, between 10% and 80%), preferably between 4/1 and 1/2 (20% and 66%).

Preferably, the encapsulant-forming layer comprises adhesion promoters, consisting of a nonpolymeric ingredient, of organic, crystalline or mineral nature and more preferably semi-mineral semi-organic nature, antioxidants and/or UV inhibitors.

It should be noted that the composition according to the invention is presented with a photovoltaic module for application but, of course, this composition can be envisaged for any other application where such a composition can advantageously be used, in particular in multilayer structures, such as, for example, (tops of) skis, adhesive films or coatings, or tubes for transporting fluids.

DESCRIPTION OF THE APPENDED FIGURES

The description which follows is given solely by way of illustration and without implied limitation with reference to the appended figures, in which:

FIG. 1, which is already described, represents an example of a photovoltaic cell, the parts (a) and (b) being ¾ views, the part (a) showing an individual cell before connection and the part (b) a view after connection of 2 individual cells; the part (c) is a top view of a complete photovoltaic cell.

FIG. 2, which is already described, represents a cross section of a photovoltaic module, the "conventional" photovoltaic sensor of which is encapsulated by an upper encapsulant film and a lower encapsulant film.

DETAILED DESCRIPTION OF THE INVENTION

As regards this abovementioned grafted polymer, use will be made of between 41% and 70%, preferably between 41% and 70%, by mass of polyamide grafts and a number of monomers (X) of between 1.3 and 20.

In order to obtain the stoichiometry between monomer X and polyamide graft for a polyamide content of between 41% and 70% by weight, it is necessary to choose the molar mass of the polyamide grafts as a function of the content of monomer X on the polyolefin backbone. Thus, by adjusting these different parameters according to the choice of final composition desired, a person skilled in the art can adjust a composition according to the invention exhibiting a content of polyamide grafts, the mass of which represents between 41% and 70% of the polyamide-grafted polymer.

As illustrative example, if it is considered that:

the monomer X is a maleic anhydride, the polyolefin backbone has a content by mass of monomer X of 3% for a number-average molar mass of 15 000 g/mol, i.e. a number of monomers X per chain of 4.6, each polyamide graft carries just one amine functionality, then the stoichiometry between the amine functionalities of the polyamide and the monomer X is obtained for a polyamide content of between 41% and 70%, if the number-average molar mass of the polyamide graft is between 2700 g/mol and 7600 g/mol.

As regards the polyolefin backbone, this is a polymer comprising an α-olefin as monomer.

Preference is given to α-olefins having from 2 to 30 carbon atoms.

Mention may be made, as α-olefin, of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene.

Mention may also be made of cycloolefins having from 3 to 30 carbon atoms, preferably from 3 to 20 carbon atoms, such as cyclopentene, cycloheptene, norbornene, 5-methyl-2-norbornene, tetracyclododecene and 2-methyl-1,4:5,8-dimethano-1,2,3,4,4a,5,8,8a-octahydronaphthalene; di- and polyolefins, such as butadiene, isoprene, 4-methyl-1,3-pentadiene, 1,4-pentadiene, 1,5-hexadiene, 1,3-hexadiene, 1,3-octadiene, 1,4-octadiene, 1,5-octadiene, 1,6-octadiene, ethylidenenorbornene, vinylnorbornene, dicyclopentadiene, 7-methyl-1,6-octadiene, 4-ethylidene-8-methyl-1,7-nonadiene and 5,9-dimethyl-1,4,8-decatriene; vinylaromatic compounds, such as mono- or polyalkylstyrenes (comprising styrene, o-methylstyrene, m-methylstyrene, p-methylstyrene, o,p-dimethylstyrene, o-ethylstyrene, m-ethylstyrene and p-ethylstyrene) and derivatives comprising functional groups, such as methoxystyrene, ethoxystyrene, vinylbenzoic acid, methyl vinylbenzoate, vinylbenzyl acetate, hydroxystyrene, o-chlorostyrene, p-chlorostyrene, divinylbenzene, 3-phenylpropene, 4-phenylpropene, α-methylstyrene, vinyl chloride, 1,2-difluoroethylene, 1,2-dichloro-ethylene, tetrafluoroethylene and 3,3,3-trifluoro-1-propene.

In the context of the present invention, the term of α-olefin also comprises styrene. Preference is given to propylene and very especially to ethylene as α-olefin.

This polyolefin can be a homopolymer when just one α-olefin is polymerized in the polymer chain. Mention may be made, as examples, of polyethylene (PE) or polypropylene (PP).

This polyolefin can also be a copolymer when at least two comonomers are copolymerized in the polymer chain, one of the two comonomers, referred to as "first comonomer", being an α-olefin and the other comonomer, referred to as "second comonomer", being a monomer capable of polymerizing with the first comonomer.

Mention may be made, as second comonomer, of:
one of the α-olefins already mentioned, this being different from the first α-olefin comonomer,
dienes, such as, for example, 1,4-hexadiene, ethylidenenorbornene or butadiene,
esters of unsaturated carboxylic acids, such as, for example, alkyl acrylates or alkyl methacrylates, combined under the term alkyl (meth)acrylates. The alkyl chains of these (meth)acrylates can have up to 30 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, hencosyl, docosyl, tricosyl, tetracosyl, pentacosyl, hexacosyl, heptacosyl, octacosyl or nonacosyl. Preference is given to methyl, ethyl and butyl (meth)acrylates as esters of unsaturated carboxylic acids.
vinyl esters of carboxylic acids. Mention may be made, as examples of vinyl esters of carboxylic acids, of vinyl acetate, vinyl versatate, vinyl propionate, vinyl butyrate or vinyl maleate. Preference is given to vinyl acetate as vinyl ester of carboxylic acid.

Advantageously, the polyolefin backbone comprises at least 50 mol % of the first comonomer; its density can advantageously be between 0.91 and 0.96.

The preferred polyolefin backbones are composed of an ethylene/alkyl (meth)acrylate copolymer. By using this polyolefin backbone, an excellent resistance to aging, to light and to temperature is obtained.

It would not be departing from the scope of the invention if different "second comonomers" were copolymerized in the polyolefin backbone.

According to the present invention, the polyolefin backbone comprises at least one residue of an unsaturated monomer (X) which can react with an acid and/or amine functional group of the polyamide graft by a condensation reaction. According to the definition of the invention, the unsaturated monomer (X) is not a "second comonomer".

Mention may be made, as unsaturated monomer (X) included on the polyolefin backbone, of:
unsaturated epoxides. These include, for example, aliphatic glycidyl esters and ethers, such as allyl glycidyl ether, vinyl glycidyl ether, glycidyl maleate, glycidyl itaconate, glycidyl acrylate and glycidyl methacrylate. These are also, for example, alicyclic glycidyl esters and ethers, such as 2-cyclohexen-1-yl glycidyl ether, diglycidyl cyclohexene-4,5-dicarboxylate, glycidyl cyclohexene-4-carboxylate, glycidyl 5-norbornene-2-methyl-2-carboxylate and diglycidyl endo-cis-bicyclo[2.2.1]hept-5-ene-2,3-dicarboxylate. Use is preferably made of glycidyl methacrylate as unsaturated epoxide.
unsaturated carboxylic acids and their salts, for example acrylic acid or methacrylic acid and the salts of these acids.
carboxylic acid anhydrides. They can be chosen, for example, from maleic anhydride, itaconic anhydride, citraconic anhydride, allylsuccinic anhydride, cyclohex-4-ene-1,2-dicarboxylic anhydride, 4-methylenecyclohex-4-ene-1,2-dicarboxylic anhydride, bicyclo[2.2.1]hept-5-ene-2,3-dicarboxylic anhydride and x-methylbicyclo[2.2.1]hept-5-ene-2,2-dicarboxylic anhydride. It is preferable to use maleic anhydride as carboxylic acid anhydride.

The unsaturated monomer (X) is preferably chosen from an unsaturated carboxylic acid anhydride and an unsaturated epoxide. In particular, in order to carry out the condensation of the polyamide graft with the polyolefin backbone, in the case where the reactive end of the polyamide graft is a carboxylic acid functional group, the unsaturated monomer (X) is preferably an unsaturated epoxide. In the case where the reactive end of the polyamide graft is an amine functional group, the unsaturated monomer (X) is advantageously an unsaturated epoxide and preferably an unsaturated carboxylic acid anhydride.

According to an advantageous version of the invention, the preferred number of unsaturated monomers (X) attached on average to the polyolefin backbone is greater than or equal to 1.3 and/or preferably less than or equal to 20.

Thus, if (X) is maleic anhydride and the number-average molar mass of the polyolefin is 15 000 g/mol, it has been found that this corresponds to a proportion of anhydride of at least 0.8% by mass of the whole of the polyolefin backbone and of at most 6.5%. These values, associated with the mass of the polyamide grafts, determine the proportion of the polyamide and of backbone in the polyamide-grafted polymer.

The polyolefin backbone comprising the residue of the unsaturated monomer (X) is obtained by polymerization of the monomers (first comonomer, optional second comonomer and optionally unsaturated monomer (X)). This polymerization can be carried out by a high pressure radical process or a solution process, in an autoclave or tubular reactor, these processes and reactors being well known to a person skilled in the art. When the unsaturated monomer (X) is not copolymerized in the polyolefin backbone, it is grafted to the polyolefin backbone. The grafting is also an operation known per se. The composition would be in accordance with the invention if several different functional monomers (X) were copolymerized and/or grafted to the polyolefin backbone.

According to the types and ratios of monomers, the polyolefin backbone may be semicrystalline or amorphous. In the case of amorphous polyolefins, only the glass transition temperature is observed whereas, in the case of semicrystalline polyolefins, a glass transition temperature and a melting point (which will necessarily be greater) are observed. It will be sufficient for a person skilled in the art to select the ratio of monomers and the molecular masss of the polyolefin backbone in order to be able to easily obtain the desired values of glass transition temperature, optionally of melting point and also of viscosity of the polyolefin backbone.

Preferably, the polyolefin has a melt flow index (MFI) of between 3 and 400 g/10 min (190° C., 2.16 kg, ASTMD 1238).

The polyamide grafts can either be homopolyamides or copolyamides.

Targeted in particular by the expression "polyamide grafts" are the aliphatic homopolyamides which result from the polycondensation:
of a lactam,
of an aliphatic α,ω-aminocarboxylic acid,
or of an aliphatic diamine and of an aliphatic diacid.

Mention may be made, as examples of lactams, of caprolactam, oenantholactam and lauryllactam.

Mention may be made, as examples of aliphatic α,ω-aminocarboxylic acid, of aminocaproic acid, 7-aminoheptanoic acid, 11-aminoundecanoic acid and 12-aminododecanoic acid.

Mention may be made, as examples of aliphatic diamine, of hexamethylenediamine, dodecamethylenediamine and trimethylhexamethylenediamine.

Mention may be made as examples of aliphatic diacid, of adipic acid, azealic acid, suberic acid, sebacic acid and dodecanedicarboxylic acid.

Mention may be made, among aliphatic homopolyamides, by way of example and without implied limitation, of the following polyamides: polycaprolactam (PA6); polyundecanamide (PA11, sold by Arkema under the Rilsan® brand); polylauryllactam (PA12, also sold by Arkema under the Rilsan® brand); polybutylene adipamide (PA4.6); polyhexamethylene adipamide (PA6.6); polyhexamethylene azelamide (PA6.9); polyhexamethylene sebacamide (PA6.10); polyhexamethylene dodecanamide (PA6.12); polydecamethylene dodecanamide (PA10.12); polydecamethylene sebacamide (PA10.10) and polydodecamethylene dodecanamide (PA12.12).

Also targeted by the expression "semicrystalline polyamides" are cycloaliphatic homopolyamides.

Mention may in particular be made of the cycloaliphatic homopolyamides which result from the condensation of a cycloaliphatic diamine and of an aliphatic diacid.

Mention may be made, as example of cycloaliphatic diamine, of 4,4'-methylenebis(cyclohexylamine), also known as bis(para-aminocyclohexyl)methane or PACM, or 2,2'-dimethyl-4,4'-methylenebis(cyclohexylamine), also known as bis(3-methyl-4-aminocyclohexyl)methane or BMACM.

Thus, mention may be made, among cycloaliphatic homopolyamides, of the polyamides PACM.12, resulting from the condensation of PACM with the $C_{12}$ diacid, and BMACM.10 and BMACM.12, resulting from the condensation of BMACM with the $C_{10}$ and $C_{12}$ aliphatic diacids respectively.

Also targeted by the expression "polyamide grafts" are the semi-aromatic homopolyamides which result from the condensation.
of an aliphatic diamine and of an aromatic diacid, such as terephthalic acid (T) and isophthalic acid (I). The polyamides obtained are then commonly known as "polyphthalamides" or PPAs;
of an aromatic diamine, such as xylylenediamine and more particularly meta-xylylenediamine (MXD), and of an aliphatic diacid.

Thus and without implied limitation, mention may be made of the polyamide 6.T, 6.I, MXD.6 or MXD.10.

The polyamide grafts brought into play in the composition according to the invention are preferably copolyamides. The latter result from the polycondensation of at least two of the groups of monomers set out above for the production of homopolyamides. The term "monomer" in the present description of the copolyamides should be taken with the meaning of "repeat unit". This is because the case where a repeat unit of the PA is composed of the combination of a diacid with a diamine is exceptional. It is considered that it is a combination of a diamine and of a diacid, that is to say the diamines/diacid pair (in an equimolar amount), which corresponds to the monomer. This is explained by the fact that, individually, the diacid or the diamine is only a structural unit, which is not sufficient in itself alone to polymerize to give a polyamide.

Thus, the copolyamides cover in particular the condensation products:
of at least two lactams,
of at least two aliphatic α,ω-aminocarboxylic acids,
of at least one lactam and of at least one aliphatic α,ω-aminocarboxylic acid,
of at least two diamines and of at least two diacids,
of at least one lactam with at least one diamine and at least one diacid,
of at least one aliphatic α,ω-aminocarboxylic acid with at least one diamine and at least one diacid,
it being possible for the diamine(s) and the diacid(s) to be, independently of one another, aliphatic, cycloaliphatic or aromatic.

According to the types and ratio of monomers, the copolyamides can be semicrystalline or amorphous. In the case of the amorphous copolyamides, only the glass transition temperature is observed whereas, in the case of the semicrystalline copolyamides, a glass transition temperature and a melting point (which will necessarily be greater) are observed.

Mention may be made, among the amorphous copolyamides which can be used in the context of the invention, for example, of the copolyamides comprising semiaromatic monomers.

Use may also be made, among the copolyamides, of semicrystalline copolyamides and in particular those of PA6/11, PA6/12 and PA6/11/12 type.

The degree of polymerization can vary within wide proportions; according to its value, it is a polyamide or a polyamide oligomer.

Advantageously, the polyamide grafts are monofunctional.

In order for the polyamide graft to have a monoamine ending, it is sufficient to use a chain-limiting agent of formula:

in which:
$R_1$ is hydrogen or a linear or branched alkyl group comprising up to 20 carbon atoms, R₂ is a linear or branched alkyl or alkenyl group having up to 20 carbon atoms, a saturated or unsaturated cycloaliphatic radical, an aromatic radical or a combination of the above. The chain-limiting agent can, for example, be laurylamine or oleylamine.

In order for the polyamide graft to have a monocarboxylic acid ending, it is sufficient to use a chain-limiting agent of formula R'₁—COOH, R'₁—CO—O—CO—R'₂ or a dicarboxylic acid.

R'₁ and R'₂ are linear or branched alkyl groups comprising up to 20 carbon atoms.

Advantageously, the polyamide graft has an end comprising an amine functionality. The preferred monofunctional polymerization chain-limiting agents are laurylamine and oleylamine.

The polyamide grafts have a molar mass of between 1000 and 10 000 g/mol. Given that the stoichiometric ratio for the grafting of the polyamide grafts to the polyolefin backbone is constant, the choice of the mass of the polyamide grafts depends on the polyamide mass desired in the composition, according to what was explained above.

The grafting of the polyamide to the polyolefin backbone takes place via the reaction between the monomer X of the polyolefin backbone and the functionality Y carried at one and only one of the ends of the polyamide. If the number of functionalities Y is greater than the number of monomers X, then a portion of the polyamide grafts will in fact be ungrafted. The stoichiometry between monomers X and functionalities Y depends on the content of monomer X carried by the polyolefin backbone, on the content of polyamide with respect to the polyolefin backbone and on the molar mass of the polyamide graft. The number of moles of monomer X and functionality Y, $n_X$ and $n_Y$, are given by:

$$n_X = \frac{x_X \cdot x_{PO}}{M_X},$$

with $x_X$, $x_{PO}$ and $M_X$ respectively the mass fraction of monomer X in the polyolefin backbone, the mass fraction of polyolefin backbone in the blend and the molar mass of the monomer X;

$$n_Y = \frac{x_{PA}}{M_{PA}},$$

with $x_{PA}$ and $M_{PA}$ respectively the mass fraction of polyamide in the blend and the number-average molar mass of the polyamide.

Stoichiometry gives $n_X=n_Y$. If it is desired for this condition to be adhered to for a content by mass of polyamide of between 45% and 70%, the molar mass of the graft has to be accordingly chosen. On choosing the polyolefin backbone, $M_X$ and $x_X$ are fixed, if $x_{PA}$ is between 45% and 70%, the molar mass of the polyamide graft is given by the relationship $$M_{PA} = \frac{M_X \cdot x_{PA}}{x_X \cdot (1 - x_{PA})}.$$

The polycondensation defined above is carried out according to the processes normally known, for example at a temperature generally between 200 and 300° C., under vacuum or under an inert atmosphere, with stirring of the reaction mixture. The main chain length of the graft is determined by the initial molar ratio of the polycondensable monomer or the lactam to the monofunctional polymerization chain-limiting agent. For the calculation of the mean chain length, one molecule of chain-limiting agent is normally allowed for one graft chain.

It will be sufficient for a person skilled in the art to select the types and ratio of monomers and also to choose the molar masses of the polyamide grafts in order to be able to easily obtain the desired values of glass transition temperature, optionally of melting point and also of viscosity of the polyamide graft.

The condensation reaction of the polyamide graft with the polyolefin backbone comprising the X residue is carried out by reaction of an amine or acid functional group of the polyamide graft with the X residue. Advantageously, monoamine polyamide grafts are used and amide or imide bonds are created by reacting the amine functional group with a functional group of the X residue.

This condensation is preferably carried out in the molten state. Conventional kneading and/or extrusion techniques can be used to manufacture the composition according to the invention. The components of the composition are thus blended to form a compounded product which can optionally be granulated at the die outlet. Advantageously, coupling agents are added during the compounding.

In order to obtain a nanostructured composition, the polyamide graft and the backbone can thus be blended in an extruder, at a temperature generally of between 200 and 300° C. The main residence time of the molten material in the extruder can be between 5 seconds and 5 minutes and preferably between 20 seconds and 1 minute. The yield of this condensation reaction is evaluated by selective extraction of the free polyamide grafts, that is to say those which have not reacted to form the polyamide-grafted polymer.

The preparation of polyamide grafts comprising an amine end and also their addition to a polyolefin backbone comprising the (X) residue is described in the patents U.S. Pat. No. 3,976,720, 3,963,799, 5,342,886 and FR 2 291 225. The polyamide-grafted polymer of the present invention advantageously exhibits a nanostructured arrangement.

The composition according to the invention can optionally be diluted in order to be incorporated in a matrix. It has been noted by the applicant company that, surprisingly, the diluting of a polyolefin compound strongly grafted with polyamide in a polyolefin matrix exhibits results, in particular mechanically, which are much more satisfactory than a polyolefin compound much less strongly grafted with polyamide (<45%) but less diluted in a polyolefin and/or polyamide matrix, so that, in the end, in both matrices (in which the two polyamide-grafted polyolefin compounds are respectively diluted), the amount of polyamide is strictly identical.

As nonlimiting example, the choice has been made to illustrate these unexpected properties obtained during the diluting of a composition according to the invention in a polyolefin matrix in the case of a photovoltaic module.

Nevertheless, it should be noted that the composition according to the invention can also be present in a polyamide-based matrix. Finally, the diluting of the composition according to the invention can be carried out in a matrix comprising both one or more polyolefin(s) and one or more polyamide(s). It should be noted that, according to one possibility offered by the invention, the polyolefin forming the matrix can carry a functional group which is reactive with respect to the polyamide graft.

The term "matrix" is used here to denote the components in which the polyamide-grafted polyolefin composition according to the invention is diluted when said components represent at least 50% by mass of the blend. By extension, the term of "matrix" is retained when the components [polyolefin(s) and/or polyamide(s)] are present in an amount, by mass, of less than 50% of the blend but it is understood that the term "matrix" then instead exhibits the role of diluent.

Thus, the composition according to the invention is diluted in a polyolefin in order to be incorporated in particular in an encapsulant layer or in the back face (back sheet) of a photovoltaic module.

The diluting of the composition according to the invention is particularly advantageous.

Tests have been carried out using the following test specimens:

Apolhya® composition example 1: composition of a polyamide-grafted polyolefin comprising 20% of polyamide grafts. The polyolefin functionalized is Lotader® 7500 from Arkema France. The polyamide graft is characterized by a number-average molar mass of 2500 g/mol and by a melting point of 130° C.

Apolhya® composition example 2: composition of a polyamide-grafted polyolefin comprising 50% of polyamide grafts. The functionalized polyolefin is Lotader® 7500. The polyamide graft is characterized by an average molar mass of 2500 g/mol and by a melting point of 130° C.

The two above Apolhya® compositions examples 1 and 2 were obtained on a twin-screw extruder of Werner® 30 type.

Two films are extruded on a single-screw extruder from Thoret®:
- a 400 μm (micrometer) film of example 1 above,
- a 400 μm film of a composition comprising 20% of polyamide grafts manufactured by diluting the composition of example 2 above in Lotader 7500 in proportions of 60% by mass of Lotader 7500 for 40% by mass of example 2 above.

Test specimens of IFC (Institut Francais du Caoutchouc [French Rubber Institute]) type are cut out from the films using a hollow punch. A stress of 0.5 bar is applied by suspending a mass at one end of the test specimen. The test specimen is placed at 100° C. for 15 minutes. The residual strain is measured after returning to ambient temperature.

The results of the creep test are presented in the table below:

|  | Apolhya test specimen example 1 | Apolhya test specimen example 2/Lotader 7500 ratio 40/60 |
| --- | --- | --- |
| Residual strain | 20% | 8% |

When the composition according to the invention is used in the encapsulant layer or layer of the back face (back sheet) of a photovoltaic module, the composition is preferably diluted and also comprises a number of additives.

Plasticizers can be added to the layer forming the encapsulant in order to facilitate the processing and to improve the productivity of the process for manufacturing the composition and the structures. Mention will be made, as examples, of paraffinic, aromatic or naphthalenic mineral oils, which also make it possible to improve the adhesiveness of the composition according to the invention. Mention may also be made, as plasticizer, of phthalates, azelates, adipates or tricresyl phosphate.

In the same way, adhesion promoters, although not necessary, can advantageously be added in order to improve the adhesiveness of the composition when adhesiveness has to be particularly high. The adhesion promoter is a nonpolymeric ingredient; it can be organic, crystalline, mineral and more preferably semi-mineral semi-organic. Mention may be made, among these, of titanates or organic silanes, such as, for example monoalkyl titanates, trichlorosilanes and trialkoxysilanes. Advantageously, use will be made of trialkoxysilanes comprising an epoxy, vinyl and amine group, in particular in the case where these adhesion promoters are provided as masterbatch with the encapsulant/back sheet according to the invention. It will also be possible to provide for these adhesion promoters to be directly grafted to the polyolefin of the encapsulant-forming layer by a technique well known to a person skilled in the art, for example reactive extrusion.

As UV radiation is capable of resulting in a slight yellowing of the composition used as encapsulant of said modules, UV stabilizers and UV absorbers (these compounds being generally called UV inhibitors), such as benzotriazole, benzophenone and the other hindered amines, can be added in order to ensure the transparency of the encapsulant during its lifetime. These compounds can, for example, be based on benzophenone or benzotriazole. They can be added in amounts of less than 10% by mass of the total mass of the composition and preferably from 0.1% to 5%.

It will also be possible to add antioxidants in order to limit the yellowing during the manufacture of the encapsulant, such as, phosphorus-comprising compounds (phosphonites and/or phosphites) and hindered phenolic compounds. These antioxidants can be added in amounts of less than 10% by mass of the total mass of the composition and preferably from 0.1% to 5%.

In the same way, flame-retardant agents can also be added to the encapsulant layer and to the layer forming the back sheet (described below). These agents may or may not be halogenated. Mention may be made, among halogenated agents, of brominated products. Use may also be made, as non-halogenated agent, of phosphorus-based additives, such as ammonium phosphate, of polyphosphate, of phosphinate or of pyrophosphate, melamine cyanurate, pentaerythritol, zeolites and the mixtures of these agents. The composition can comprise these agents in proportions ranging from 3% to 40%, with respect to the total mass of the composition. It will also be possible to add coloring or brightening compounds.

Pigments, such as, for example, coloring or brightening compounds, can also be added to the encapsulant layer in proportions generally ranging from 5% to 15%, with respect to the total mass of the composition.

Preparation of the Composition According to the Invention:

The technique for grafting the polyamide grafts to the polyolefin backbone in order to obtain the polyamide-grafted polyolefin according to the invention is well known to a person skilled in the art, in particular from the above-mentioned documents FR 2 912 150, FR 2 918 150 and EP 2 196 489.

It is thus not departing from the scope of the invention if crosslinking agents are added. Mention may be made, as examples, of organic peroxides or isocyanates. This crosslinking can also be carried out by known irradiation techniques. This crosslinking can be carried out by one of the many methods known to a person skilled in the art, in particular by the use of thermally activated initiators, for example peroxide and azo compounds, or photoinitiators, such as benzophenone, by radiation techniques comprising light rays, UV rays, electron beams and X rays, of silanes carrying reactive functional groups, such as an aminosilane, an epoxysilane or a vinylsilane, such as, for example, vinyltriethoxysilane or vinyltrimethoxysilane, and wet-route cros slinking. The handbook entitled "Handbook of Polymer Foams and Technology", supra, on pages 198 to 204, provides additional teaching to which a person skilled in the art may refer.

As regards the aspects of the invention relating to the use of the thermoplastic composition in a photovoltaic module, a person skilled in the art may refer, for example, to the Handbook of Photovoltaic Science and Engineering, Wiley, 2003. Specifically, the composition of the invention can be used as encapsulant or encapsulant/back sheet in a photovoltaic module, the structure of which is described in connection with the appended figures.

Materials Employed to Form the Test Formulations:

Lotader® 7500: terpolymer of ethylene, of ethyl acrylate (17.5% by mass) and of maleic anhydride (2.8% by mass) produced by Arkema, having an MFI (190° C. under 2.16 kg, measured according to ISO 1133) of 70 g/10 min.

Lotader® 4210: terpolymer of ethylene, of butyl acrylate (6.5% by mass) and of maleic anhydride (3.6% by mass) produced by Arkema, having an MFI (190° C. under 2.16 kg, measured according to ISO 1133) of 9 g/10 min.

Lotader® 6200: terpolymer of ethylene, of ethyl acrylate (6.5% by mass) and of maleic anhydride (2.8% by mass) produced by Arkema, having an MFI (190° C. under 2.16 kg, measured according to ISO 1133) of 40 g/10 min.

Prepolymer PA6: Two prepolymers PA6 were synthesized by polycondensation starting from lactam 6. Lauryllactam is used as chain-limiting agent so as to have just one primary amine functionality at the chain end. The number-average molar mass of the first prepolymer is 2500 g/mol and that of the second prepolymer is 4000 g/mol.

Copolyamide prepolymer having a melting point of 130° C.: a copolyamide 6/12 prepolymer was synthesized by polycondensation starting from lactam 6 and lactam 12. The lactam 6/lactam 12 ratio is adjusted in order to obtain a melting point of 130° C. Laurylamine is used as chain-limiting agent so as to have just one primary amine functionality at the chain end. Its number-average molar mass is 2500 g/mol.

Apolhya®: the Apolhya family is a family of polymers sold by Arkema which combine the properties of polyamides with those of polyolefins by virtue of the attainment of morphologies which are co-continuous at the nanometric scale. In the context of the tests, several types of Apolhya® are selected:

an Apolhya® family respectively exhibiting 10%, 20%, 30%, 40%, 45%, 50%, 55%, 60%, 65% and 70% on the basis of Lotader® 7500 and of copolyamide 6/12 (used for the haze test).

an Apolhya® family respectively exhibiting 10%, 20%, 30%, 40%, 45%, 50%, 55%, 62.5% and 70% on the basis of Lotader® 4210 and of prepolymer PA6 with a molar mass of 2500 g/mol (used for the MFI test).

an Apolhya® family respectively exhibiting 10%, 20%, 30%, 40%, 45%, 50%, 60% and 70% on the basis of Lotader® 6200 and of prepolymer PA6 with a molar mass of 2500 g/mol (used for the MFI test).

an Apolhya® family respectively exhibiting 10%, 20%, 30%, 40%, 45%, 50%, 55%, 62.5% and 70% on the basis of Lotader® 4210 and of prepolymer PA6 with a molar mass of 4000 g/mol (used for the MFI test).

Production of the Test Formulations and Films:

Reactive extrusion of the Apolhya formulations

Reactive extrusion of the formulations based on Lotader 7500 and copolyamide 6/12

These Apolhya® formulations were prepared by compounding by virtue of a corotating twin-screw extruder of ZSK 30 type from Coperion Werner and Pfleiderer®, the barrel elements of which are heated according to a flat profile at 200° C.; the rotational speed is 300 rpm (rounds per minute) with a throughput of 25 kg/h (kilograms per hour).

Reactive extrusion of the Apolhya formulations based on Lotader 4210 and polyamide 6

These Apolhya® formulations were prepared by compounding by virtue of a small corotating twin-screw laboratory extruder of Haake 2 type. The barrel elements are heated according to a flat profile at 240° C.; the rotational speed of the screws is 300 rpm.

Extraction of a 400 µm monolayer film of Apolhya or Lotader

Reactive extrusion of the formulations based on Lotader 7500 and copolyamide 6/12

400 µm (micrometer) monolayer films were produced by cast film extrusion on an extrusion line of Dr Collin® brand. This extrusion line is composed of three extruders equipped with a polyolefin standard screw profile, with a variable coextrusion block (variable feed block) and with a 250 mm coat hanger die.

The following process parameters were used for the extrusion of the 400 µm monolayer film of Apolhya, whatever its polyamide content, and also for the Lotader:

T° extrusion is 150° C. (degrees Celsius),

T° (temperature) of the coextrusion box and die: 160° C., the line speed is 2.6 m/min (meters per minute).

Reactive extrusion of the formulations based on Lotader 4210 and polyamide 6

400 µm (micrometer) monolayer films were produced by cast film extrusion on a small laboratory extrusion line. It is a counter-rotating twin-screw device of Haake 1 type equipped with a flat die with a width of 10 cm (centimeters) and with an opening of 0.5 mm (millimeter). The barrel elements are heated according to a flat profile at 210° C.; the rotational speed of the screws is 60 rpm.

Tests Carried Out on the Films:

Test on the Melt Flow Index:

The melt flow index was measured using a Gottfert MI3 melt flow indexer according to the standard ISO 1133. The MFI of the Apolhya® products based on prepolymer PA6 was measured under a mass of 2.16 kg at 230° C. and that of the Lotader® products and of the Apolhya® products based on copolyamide 6/12 under a mass of 2.16 kg at 190° C.

Results of Melt Flow Index for the Formulations Based on Lotader 6200 and Prepolymer PA6

| % of polyamide with a molar mass of 2500 g/mol | MFI |
| --- | --- |
| 0 | 40 (190° C.) |
| 10 | 19 |
| 20 | 9 |
| 30 | 1 |
| 40 | 3 |
| 45 | 6 |
| 50 | 25 |
| 60 | 50 |
| 70 | 90 |

These results show that, contrary to what could be envisaged, the MFI of the compositions beyond 40% of grafted polyamide no longer decreases beyond, indeed even increases. This renders the composition able to be used industrially without any difficulty.

Results of Melt Flow Index for the Formulations Based on Lotader 4210 and Prepolymer PA6

| % of polyamide with a molar mass of 2500 g/mol | MFI | % of polyamide with a molar mass of 4000 g/mol | MFI |
|---|---|---|---|
| 0 | 9 (190° C.) | 0 | 9 (190° C.) |
| 10 | 15 | 10 | 20 |
| 20 | 4 | 20 | 8 |
| 30 | 2 | 30 | 4 |
| 40 | 1 | 40 | 2 |
| 45 | 5 | 45 | 7 |
| 50 | 10 | 50 | 15 |
| 62.5 | 25 | 50 | 15 |
| 70 | 50 | 70 | 95 |

These results show that, contrary to what could be envisaged, the MFI of the compositions beyond 40% of grafted polyamide no longer decreases beyond, indeed even increases. This renders the composition able to be used industrially without any difficulty.

Haze Test:

The results for the test specimens are presented in the table below:

| | Transmittance in the visible region (th 400 µm) | Haze (%) |
|---|---|---|
| Lotader | 95 | 9 |
| Apolhya comprising 10% of content by mass of PA grafting | 96.0 | 6 |
| Apolhya comprising 20% of content by mass of PA grafting | 96.5 | 3 |
| Apolhya comprising 30% of content by mass of PA grafting | 96.5 | 3 |
| Apolhya comprising 40% of content by mass of PA grafting | 96.5 | 3 |
| Apolhya comprising 45% of content by mass of PA grafting | 96 | 3 |
| Apolhya comprising 50% of content by mass of PA grafting | 96 | 3 |
| Apolhya comprising 55% of content by mass of PA grafting | 96 | 3 |
| Apolhya comprising 60% of content by mass of PA grafting | 95.5 | 3 |
| Apolhya comprising 65% of content by mass of PA grafting | 95.0 | 5 |
| Apolhya comprising 70% of content by mass of PA grafting | 94 | 8 |

These results, obtained from the Apolhya formulations based on Lotader 7500 and on copolyamide 6/12, clearly show, and contrary again to what could be expected theoretically and empirically, that the films of compositions having a high content by mass of grafted polyamide are at least as transparent as those having a low content of grafted polyamide.

The invention claimed is:

1. A thermoplastic composition comprising a polyamide-grafted polymer from a polyolefin backbone comprising a residue of at least one unsaturated monomer and a plurality of polyamide grafts, in which:
   the polyamide grafts are attached to the polyolefin backbone by the residue of the unsaturated monomer (X) comprising a functional group capable of reacting by a condensation reaction with a polyamide having at least one amine end and/or at least one carboxylic acid end,
   the residue of the unsaturated monomer (X) is attached to the backbone by grafting or copolymerization,
   wherein the polyamide grafts represent from 41% to 70% by mass of said polyamide-grafted polymer, and
   wherein the composition additionally comprises a matrix composed of at least one polyolefin, the ratio by mass of said matrix with respect to the polyamide-grafted polyolefin being between 9/1 and 4/1.

2. The composition as claimed in claim 1, wherein the grafted polymer is nanostructured.

3. The composition as claimed in claim 1, wherein the number-average molar mass of the polyamide grafts of the grafted polymer is within the range extending from 1000 to 10,000 g/mol.

4. The composition as claimed in claim 1, wherein, for the grafted polymers, the number of monomers (X) attached to the polyolefin backbone is from 1.3 to 20.

5. The composition as claimed in claim 1, wherein the choice of the molar mass of the polyamide grafts, in order to obtain the polyamide-grafted polymer in which the polyamide grafts represent from 41% to 70% by mass of said polymer, depends on the one hand, on the molar mass of the polyolefin backbone and, on the other hand, on the content of monomers (X) on said polyolefin backbone.

6. The composition as claimed in claim 1, wherein at least one polyamide graft of the grafted polymer comprises at least one copolyamide or one polyamide 6.

7. The composition as claimed in claim 1, wherein the unsaturated monomer is a maleic anhydride.

8. A thermoplastic film comprising the composition as claimed in claim 1.

9. A thermoplastic film of a photovoltaic module, said photovoltaic module comprising at least two layers, one of which forms the encapsulant layer and/or a back protective layer, wherein the encapsulant layer and/or the back protective layer comprises the polyamide-grafted polyolefin composition as claimed in claim 1.

10. The film as claimed in claim 9, wherein the encapsulant layer and/or the back protective layer additionally comprises a polyolefin, the ratio by mass of said polyolefin with respect to the polyamide-grafted polyolefin composition being between 9/1 and 1/4.

11. The film as claimed in claim 9, wherein the encapsulant-forming layer comprises adhesion promoters, consisting of a nonpolymeric ingredient, of organic, crystalline or mineral nature.

12. The composition as claimed in claim 1, wherein the polyamide grafts represent from 45% to 70% by mass of said polyamide-grafted polymer.

13. The film as claimed in claim 10, the ratio by mass of said polyolefin with respect to the polyamide-grafted polyolefin composition being between 4/1 and 1/2.

14. The film as claimed in claim 11, wherein the encapsulant-forming layer comprises adhesion promoters are semi-mineral semi-organic nature, antioxidants and/or UV inhibitors.

15. The composition as claimed in claim 1, wherein the composition has a melt flow index (MFI) of between 3 and 400 g/10 min (190° C., 2.16 kg, ASTMD 1238).

\* \* \* \* \*